United States Patent
Kawabata et al.

(10) Patent No.: US 10,840,620 B2
(45) Date of Patent: Nov. 17, 2020

(54) SOCKET

(71) Applicant: Molex, LLC, Lisle, IL (US)

(72) Inventors: Masato Kawabata, Yamato (JP);
Hiroshi Shimoyama, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/289,693

(22) Filed: Mar. 1, 2019

(65) Prior Publication Data
US 2019/0372253 A1    Dec. 5, 2019

(30) Foreign Application Priority Data
May 30, 2018    (JP) ................................ 2018-103661

(51) Int. Cl.
*H01R 12/70* (2011.01)
*H01R 12/58* (2011.01)
(Continued)

(52) U.S. Cl.
CPC ......... *H01R 12/7076* (2013.01); *H01R 12/57* (2013.01); *H01R 12/58* (2013.01); *H01R 12/716* (2013.01); *H01R 13/03* (2013.01); *H01R 13/24* (2013.01); *H01R 13/502* (2013.01); *H01R 33/76* (2013.01); *H05K 3/301* (2013.01); *H05K 2201/10325* (2013.01)

(58) Field of Classification Search
CPC ........ H01R 23/722; H01R 9/096; H05K 3/30; H05K 2201/10325
USPC ................... 439/66, 717, 716, 532
See application file for complete search history.

(56) References Cited

U.S. PATENT DOCUMENTS 2,534,864 A * 12/1950 Morris ................. H01R 9/2408
439/717
2,884,613 A *  4/1959 Chandler, Jr. ....... H01R 9/2408
439/717
(Continued)

FOREIGN PATENT DOCUMENTS

CN           202600189 U    12/2012
CN           205282717 U    6/2016
(Continued)

OTHER PUBLICATIONS

First Office action and Search report received for CN application No. 201910451032.6 dated Jun. 28, 2020, 15 pages. (8 pages of english translation and 7 pages of official copy).

*Primary Examiner* — Gary F Paumen
(74) *Attorney, Agent, or Firm* — Molex, LLC

(57) ABSTRACT

A terminal unit assembly in which a plurality of terminal units extending in a longitudinal direction are arranged in a lateral direction orthogonal to the longitudinal direction, and a frame member including an assembly accommodating recess for accommodating the terminal unit assembly; wherein the terminal unit includes a longitudinally extending terminal holding part, a main body held by the terminal holding part, a plurality of terminals including contact parts protruding above the top face or below the bottom face of the terminal unit and contact arms connecting the main body to the contact parts, and a housing wall extending in the longitudinal direction; and the terminal holding part includes a plurality of laterally protruding protrusions, and at least one of the protrusions abuts against a housing wall of an adjacent terminal unit.

26 Claims, 13 Drawing Sheets

(51) Int. Cl.
*H01R 33/76* (2006.01)
*H01R 13/502* (2006.01)
*H01R 13/24* (2006.01)
*H01R 12/71* (2011.01)
*H01R 12/57* (2011.01)
*H05K 3/30* (2006.01)
*H01R 13/03* (2006.01)

(56) References Cited

U.S. PATENT DOCUMENTS

| | | | | |
|---|---|---|---|---|
| 3,189,866 A * | 6/1965 | Lazar | | H01R 25/006 439/717 |
| 3,456,231 A * | 7/1969 | Zimmerman, Jr. | | H01R 13/20 439/532 |
| 3,899,237 A * | 8/1975 | Briggs, Jr. | | H01R 4/2429 439/405 |
| 3,980,384 A * | 9/1976 | Lawson | | H01R 9/2408 439/710 |
| 4,322,120 A * | 3/1982 | Rilling | | H01R 12/716 439/631 |
| 4,641,426 A * | 2/1987 | Hartman | | H05K 3/3447 228/180.1 |
| 4,797,123 A * | 1/1989 | Weber | | H01R 12/7088 439/717 |
| 5,135,415 A * | 8/1992 | Huber | | H01R 9/2608 439/347 |
| 5,226,823 A * | 7/1993 | Johnson | | H05K 7/023 439/66 |
| 5,772,472 A * | 6/1998 | Beutler | | H01R 13/6585 439/607.08 |
| 5,893,761 A * | 4/1999 | Longueville | | H01R 12/714 439/607.11 |
| 5,904,580 A * | 5/1999 | Kozel | | H01R 12/52 439/66 |
| 6,196,869 B1 * | 3/2001 | Kay | | H01R 9/2441 439/532 |
| 6,709,279 B2 * | 3/2004 | Uratsuji | | G01R 1/0483 439/66 |
| 7,195,519 B1 * | 3/2007 | McAlonis | | H01R 13/518 439/607.39 |
| 7,316,591 B2 * | 1/2008 | Ferderer | | H01R 13/506 439/532 |
| 7,572,156 B2 * | 8/2009 | Schroll | | H01R 13/514 439/717 |
| 7,713,096 B2 * | 5/2010 | Pavlovic | | H01R 13/514 439/701 |
| 8,684,772 B2 * | 4/2014 | Yu | | H01R 12/724 439/717 |
| 8,858,238 B2 * | 10/2014 | Luo | | H01R 12/7082 439/66 |
| 2009/0325398 A1 * | 12/2009 | Ma | | H01R 12/57 439/66 |
| 2011/0159737 A1 | 6/2011 | Lin et al. | | |
| 2014/0162472 A1 * | 6/2014 | Walden | | H01R 12/714 439/66 |

FOREIGN PATENT DOCUMENTS

| | | |
|---|---|---|
| CN | 206041151 U | 3/2017 |
| CN | 110247481 A | 9/2019 |
| JP | 2005-174622 A | 6/2005 |

\* cited by examiner

Prior art

SOCKET

RELATED APPLICATIONS

This application claims priority to Japanese Application No, 2018-103661, filed on May 30, 2018, which application is incorporated herein by reference in its entirety.

TECHNICAL FIELD

The present disclosure relates to a socket.

BACKGROUND ART

Conventionally, a semiconductor device such as an integrated circuit (IC) or a large-scale integrated circuit (LSI) with a terminal of a pin grid array (PGA) type is connected to a circuit board such as a printed circuit board when an IC tester is used for testing. In such a case, the terminal of the semiconductor device is electrically connected to a conductive trace of the circuit board, via of a socket attached to the circuit board (for example, refer to Patent Document 1).

FIG. 13 is a perspective view of a conventional socket.

In the drawing, reference numeral 811 denotes a frame member of a housing for a socket used for connecting a semiconductor device to a circuit board, which is a member having a substantially U-shaped planar shape and in which an opening 812 is formed. The end of the opening 812 is closed by a mounting member 814 which, together with the frame member 811, forms a housing. A plurality of holes 813 are formed in the frame member 811. The hole 813 is used to fix the housing to a printed circuit board (not shown).

Reference numeral 821 denotes a substantially U-shaped plate member, and a plurality of grooves are formed in both arms of the U-shaped plate member. Each of a plurality of contact pins 861 is inserted into a corresponding groove of the plate member 821. The plate member 821 is mounted to the opening 812 of the frame member 811 with a plurality of sheets being polymerized in a thickness direction, and is secured to the frame member 811 by closing one end of the opening 812 with the mounting member 814.

Patent Document 1: Japanese Unexamined Patent Application Publication No. 2005-174622

SUMMARY

However, in the above-mentioned conventional socket, since a large number of plate members 821 are stacked in the thickness direction, even if the dimensional tolerance of each plate member 821 in the thickness direction is small, the overall dimensional tolerance in the stacking direction becomes large, thereby lowering the positional accuracy of each contact pin 861. Further, since both ends of the plate member 821 in the longitudinal direction are fixed by the frame member 811, when the thermal expansion coefficients of the plate member 821 and the frame member 811 are different from each other, thermal stress is generated in each member when the temperature change of the surrounding environment of the socket is large.

It is an object of the present disclosure to solve the above-mentioned problems and provide a socket which is simple in structure, low in cost, and high in durability without overall dimensional tolerance becoming large as a result of accumulated dimensional tolerances from each member.

For achieving the object, the socket includes a terminal unit assembly in which a plurality of terminal units extending in a longitudinal direction are arranged in a lateral direction orthogonal to the longitudinal direction, and a frame member including an assembly accommodating recess for accommodating the terminal unit assembly; wherein the terminal unit includes a terminal holding part extending in the longitudinal direction, a main body held by the terminal holding part, a plurality of terminals including contact parts protruding above the top face or below the bottom face of the terminal unit and contact arms connecting the contact parts to the main body, and a housing wall extending in the longitudinal direction; and the terminal holding part includes a plurality of protrusions protruding in the lateral direction and at least one protrusion abuts a housing wall of an adjacent terminal unit.

In another socket, at least one protrusion abuts the housing wall of an adjacent terminal unit via adhesive.

In yet another socket, at least one protrusion is deformed by abutting a housing wall of an adjacent terminal unit.

In yet another socket, the protrusion includes an adhesive piece, having a distal face abutting the housing wall of an adjacent terminal unit via adhesive, and a contacting piece, having a distal face which deforms by abutting the housing wall of the adjacent terminal unit.

In yet another socket, the lateral protrusion amount of the contacting piece is larger than the lateral protrusion amount of the adhesive piece.

In yet another socket, there is a gap between the contacting piece and the adhesive piece.

In yet another socket, contacting pieces and adhesive pieces are alternately arranged in the longitudinal direction.

In yet another socket, the position of the contacting piece with respect to the longitudinal direction is different from the position of the contacting piece of the adjacent terminal unit with respect to the longitudinal direction.

In yet another socket, the contacting pieces of the terminal unit assembly are staggered in plan view.

In a method of manufacturing a socket, the terminal unit assembly is assembled by compressing a plurality of terminal units arranged side by side in the lateral direction, and deforming a distal faces of the contacting pieces against the housing wall of an adjacent terminal unit.

According to the present disclosure, the sizes of the sockets are not increased due to accumulation of dimensional tolerance of each member. Thus, a socket featuring a simplified structure, a lower cost, and higher durability can be achieved.

DETAILED DESCRIPTION OF THE PREFERRED EMBODIMENTS

An embodiment will be described in detail below with reference to the drawings.

Figure 1:
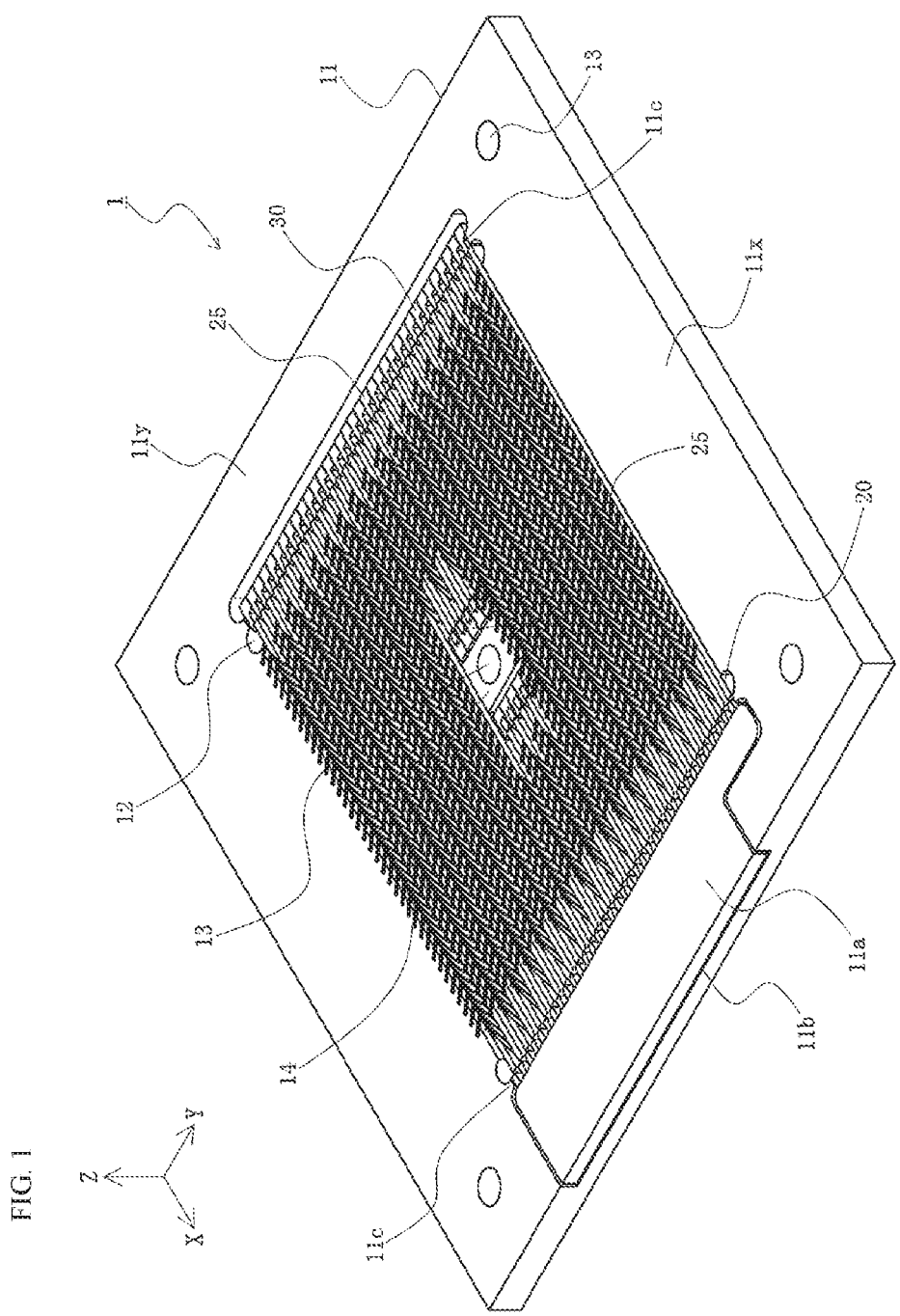
FIG. 1 is a perspective view of a socket according to the present embodiment.
Figure 2:
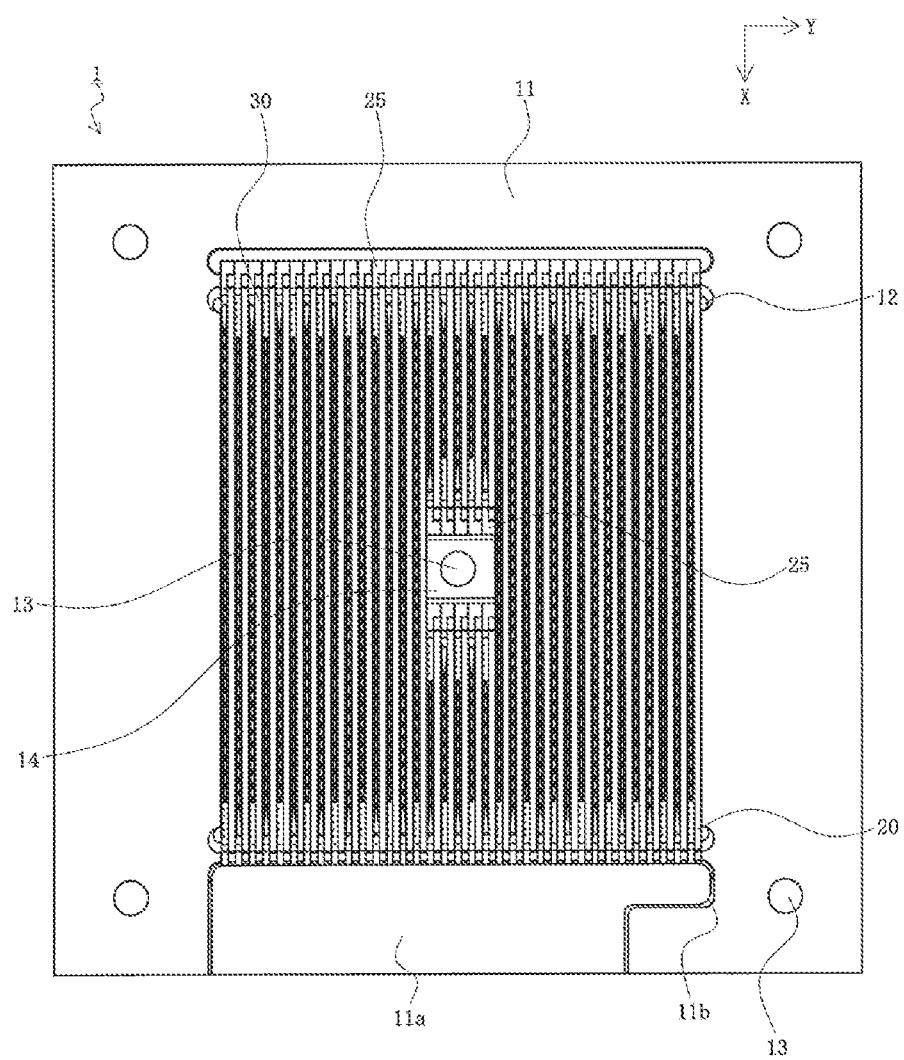
FIG. 2 is a top view of the socket according to the present embodiment.
Figure 3:
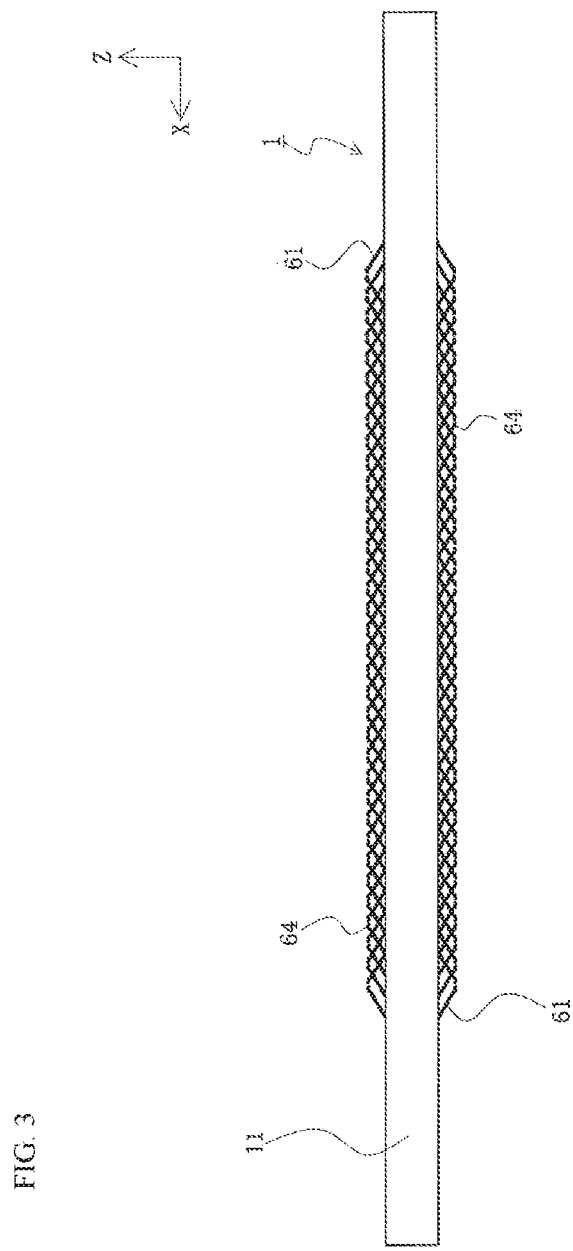
FIG. 3 is a side view of the socket according to the present embodiment.

FIG. 1 is a perspective view of a socket in the present embodiment, FIG. 2 is a top view of the socket, and FIG. 3 is a side view of the socket.

In the drawings, reference numeral 1 denotes a socket according to the present embodiment, the socket having a terminal unit assembly 20 in which a plurality of terminal units 30, including a plurality of terminals 61, are assembled, and a frame member 11 as a frame for holding the terminal unit assembly 20. The number of terminal units 30 included in a terminal unit assembly 20 and the number of terminals 61 included in each terminal unit 30 may be changed as appropriate.

The frame member 11 is a flat plate-shaped member having a substantially rectangular outer shape in the X-Y plane, which defines the periphery of the assembly accommodating recess 12 having a substantially rectangular shape in the X-Y plane in plan view, and the frame member 11 is integrally formed of a metal material such as steel. In a state where the terminal unit assembly 20 is accommodated in the assembly accommodating recess 12, the socket 1 has a thick plate-like outer shape that is substantially rectangular on the X-Y plane, and has an upper surface (Z-axis positive direction surface) and a lower surface (Z-axis negative direction surface) that are flat-parallel surfaces.

The frame member 11 includes a pair of longitudinal frame parts 11x extending in the X-axis direction and a pair of lateral frame parts 11y extending in the Y-axis direction, and engaging parts 25 formed at both ends of the terminal unit 30 in the X-axis direction engage with edge parts 11c of the lateral frame parts 11y facing the assembly accommodating recess 12. Specifically, the edge parts 11c include a comb-shaped part (not shown), and an engaging recess 26A, 26B (to be described later) formed on the bottom face of the engaging part 25 engages with the comb-shaped part. The engaging part 25 at the negative X-axis direction end of the terminal unit 30 is adhered to the edge part 11c of the lateral frame part 11y located on the negative X-axis direction side, but the engaging part 25 at the positive X-axis direction end of the terminal unit 30 is not adhered to the edge part 11c of the lateral frame part 11y located on the positive X-axis direction side, and due to a gap between the edge part 11c and the engaging recess 26A, 26B, the engaging part 25 is displaceable in the X-axis direction with respect to the edge part 11c. Here, a push plate accommodating recess 11b is formed on the top face of the lateral frame part 11y positioned on the positive X-axis direction side, and the push plate 11a is accommodated in the push plate accommodating recess 11b. The vicinity of the negative X-axis direction end of the push plate 11a abuts or comes close to the top face (i.e., the positive Z-axis direction face) of the engaging part 25 engaged with the edge part 11c of the lateral frame part 11y, and prevents the engaging part 25 from being displaced upward and coining off the edge part 11c.

Further, in the initial state of the socket 1, that is, in a state in which the socket 1 is not being used to connect a connection target device (not shown) and an external force is not applied to the terminal 61 or the like, the contact part 64 of each terminal 61 protrudes from the top face and the bottom face of the socket 1. The bottom face of the socket 1 is then pressed against the top face of one connection target device disposed below the socket 1 (in the negative Z-axis direction), the top face is pressed against the bottom face of another connection target device disposed above the socket 1 (in the positive Z-axis direction), and the contact part 64 contacts the counter terminal (not shown) disposed on the top face of one connection target device and the mating terminal (not shown) disposed on the bottom face of the other connection target device.

Further, the frame member 11 has a guide hole 13 for inserting a cylindrical guide member (not shown) for positioning the connection target device. The number and arrangement of the guide holes 13 are appropriately fixed to correspond to the number and arrangement of the guide members. In the example shown in the drawing, in order to accommodate the case in which a guide member is positioned to pass through the center of the assembly accommodating recess 12, in addition to the guide holes 13 in the four corners of the frame member 11, a guide frame member 14 having a guide hole 13 is fixed at the center of the assembly accommodating recess 12. The terminal units 30 accommodated in the assembly accommodating recess 12 at positions corresponding to the guide frame member 14 are formed so that the dimension in the X-axis direction is shorter than that of other terminal units 30 and the engaging part 25 on the guide frame member 14 side engages with the guide frame member 14.

The guide frame member 14, being connected to the target device according to the arrangement of the terminals of the connection target device, may be disposed at a position other than the center of the assembly accommodating recess 12 depending on the shape and the like of the socket 1 set to match the shape of the connection target device. Further, a plurality of elements may be arranged.

The connection target device is, for example, on the one hand, an IC, an LSI, or the like, or, on the other hand, an inspection circuit board of a semiconductor inspection device, but may be any type of electric device or electronic device as long as at least one face thereof is provided with a flat terminal that can be brought into contact with the contact part 64, or may be a circuit board thereof, and may be, for example, a wiring circuit board such as a motherboard or a daughter board in an electronic device such as a computer, a television, a game machine, a camera, or a navigation device.

Note that in the present embodiment, expressions indicating the directions such as up, down, left, right, front, and back that are used to describe the configuration and operation of each part included in the socket 1 and other members are relative and not absolute, and they are suitable when each part included in the socket 1 and the other members are in the positions illustrated by the drawings; however, when the position of each part included in the socket 1 and the other members are changed, then each part should be interpreted with changes corresponding to the changes of the positions.

Next, a configuration of the terminal unit assembly 20 will be described in detail.

Figure 4:
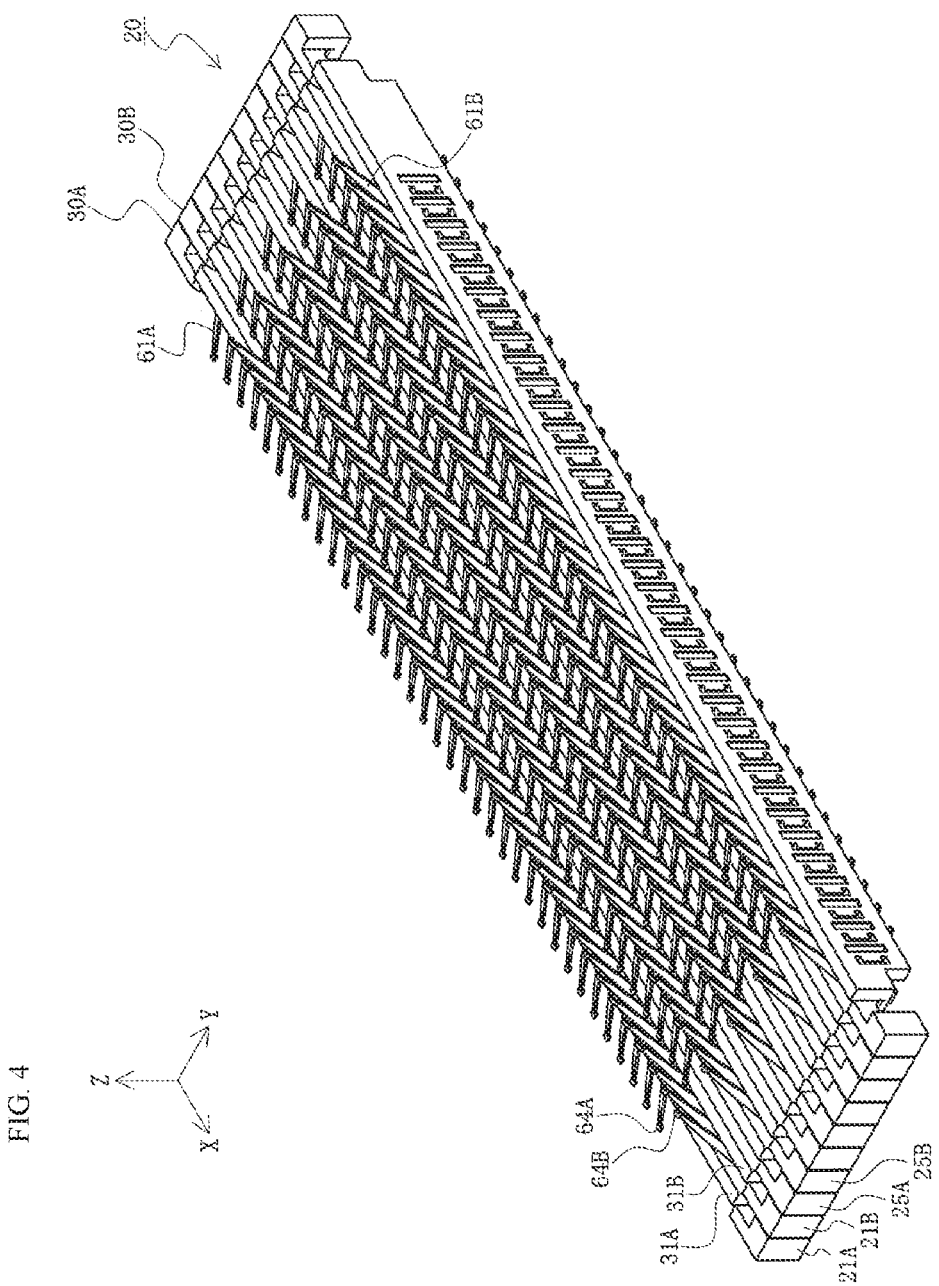
FIG. 4 is a perspective view of a small terminal unit assembly according to the present embodiment.
Figure 5:
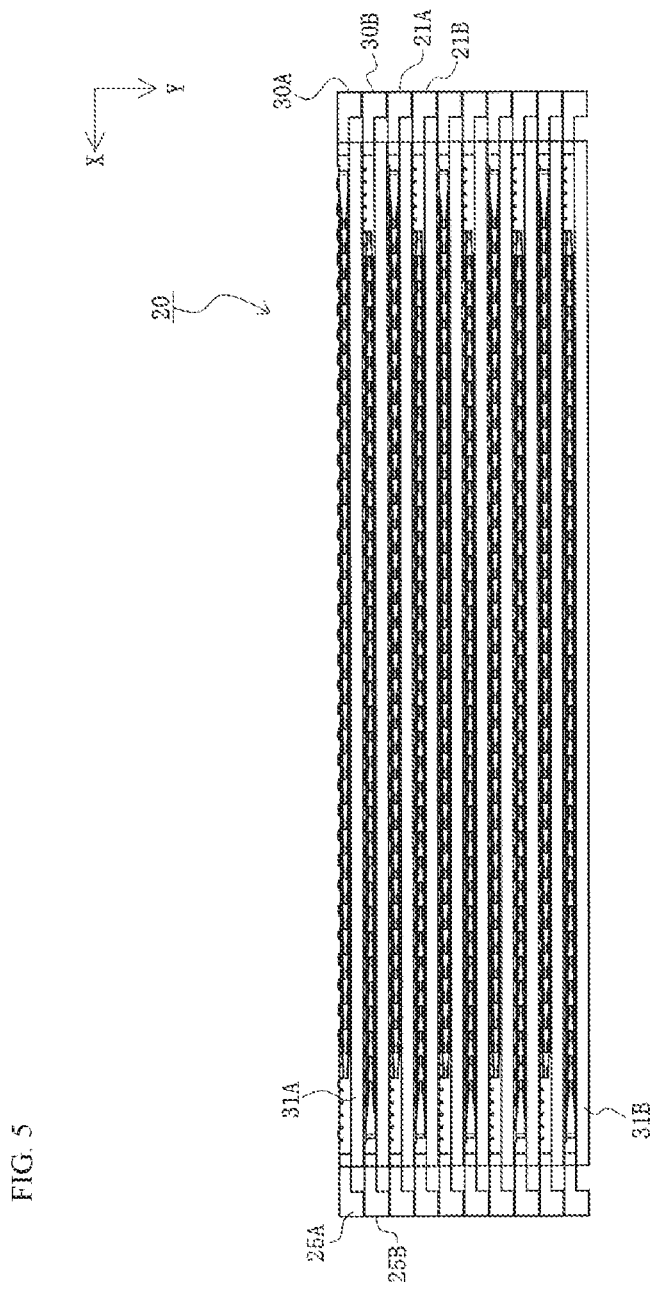
FIG. 5 is a top view of a small terminal unit assembly according to the present embodiment.
Figure 6:
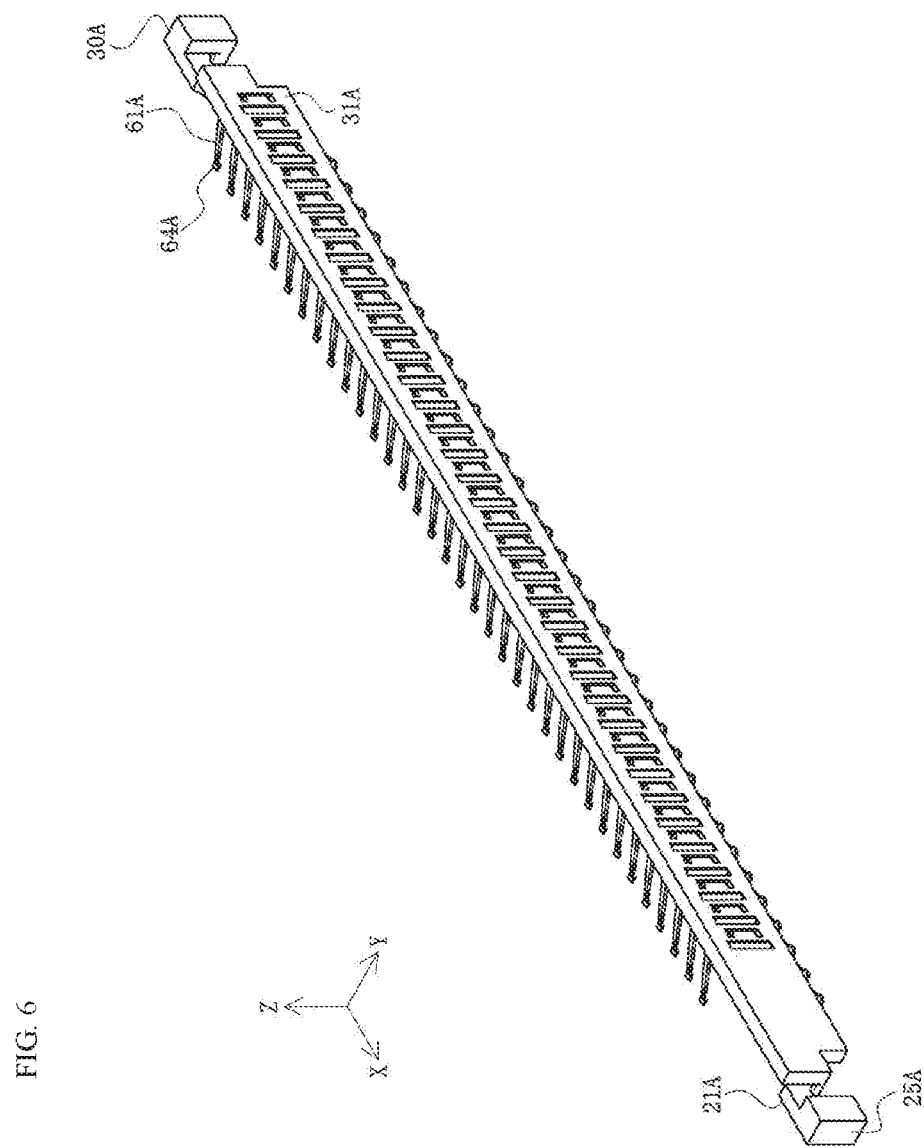
FIG. 6 is a perspective view showing a side wall of a first terminal unit according to the present embodiment.
Figure 8:
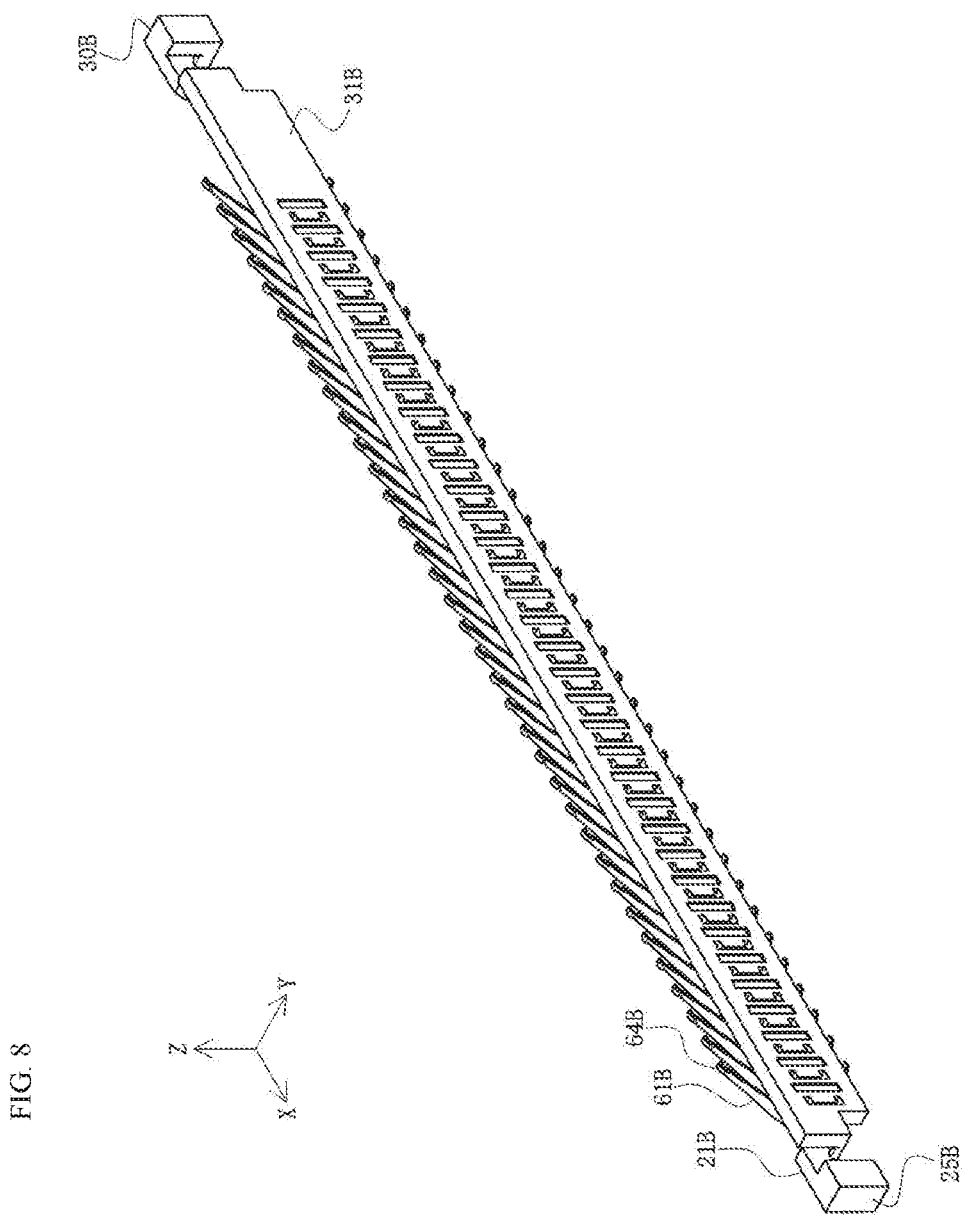
FIG. 8 is a perspective view showing a side wall of a second terminal unit according to the present embodiment.
Figure 9:
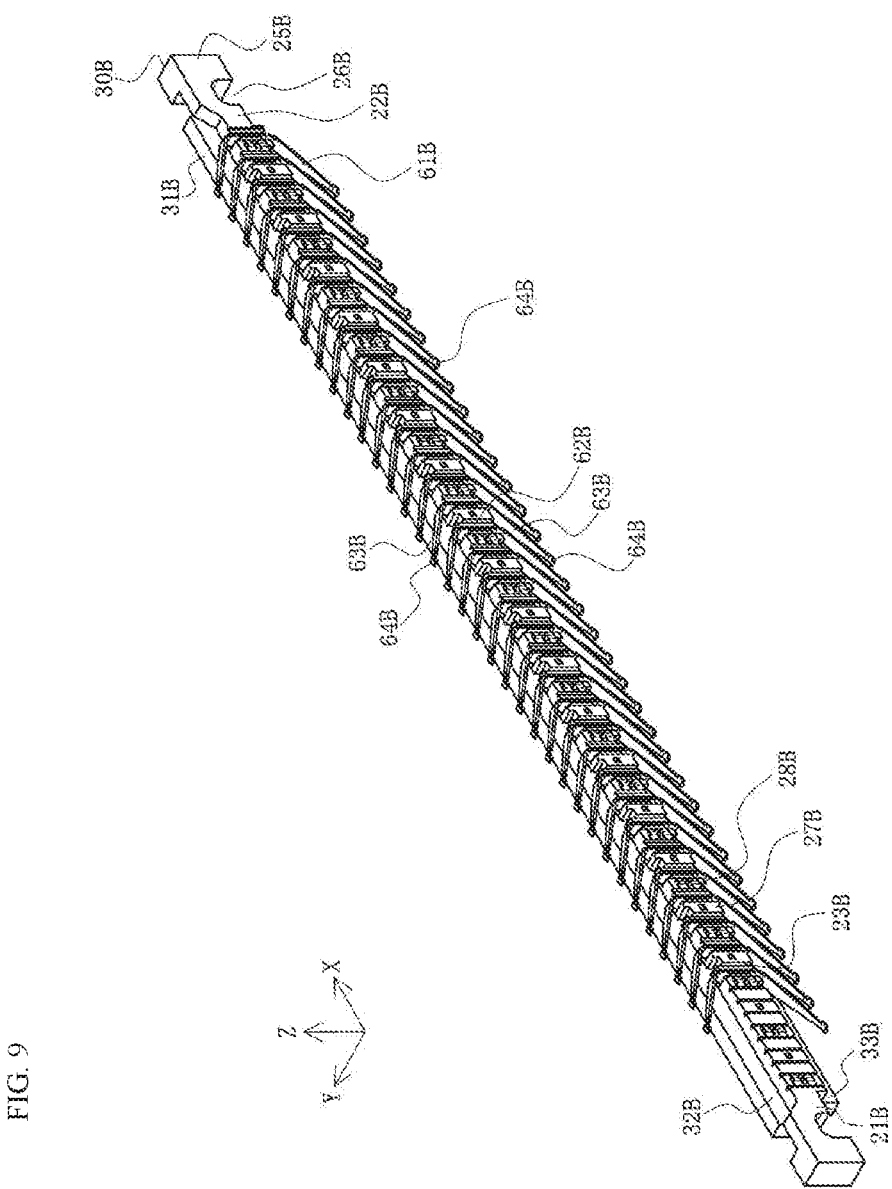
FIG. 9 is a perspective view showing the terminal side of the second terminal unit according to the present embodiment.
Figure 10:
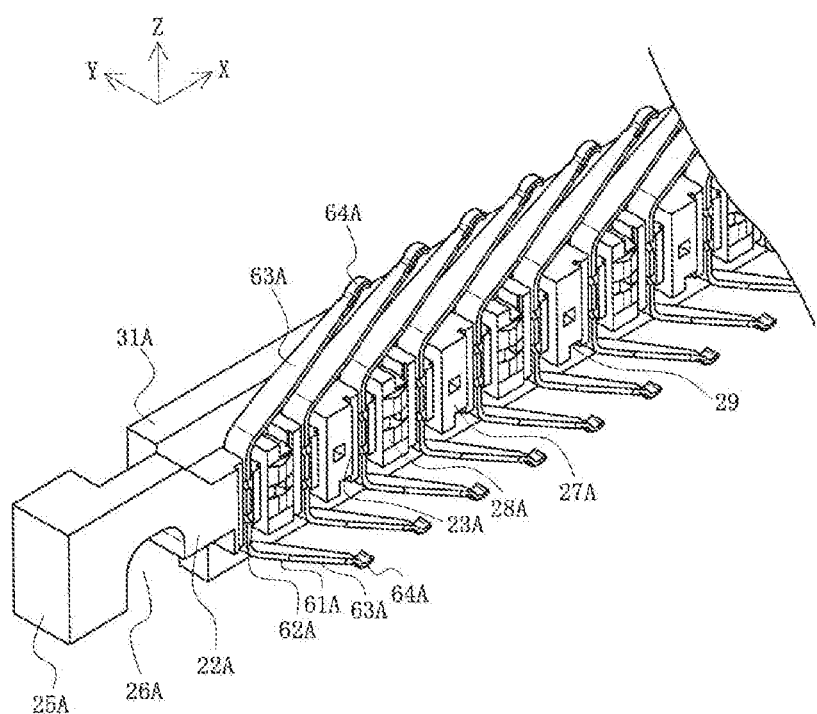
FIG. 10 is an enlarged perspective view of part A in FIG. 7 showing a main part of the first terminal unit according to the present embodiment.
Figure 11:
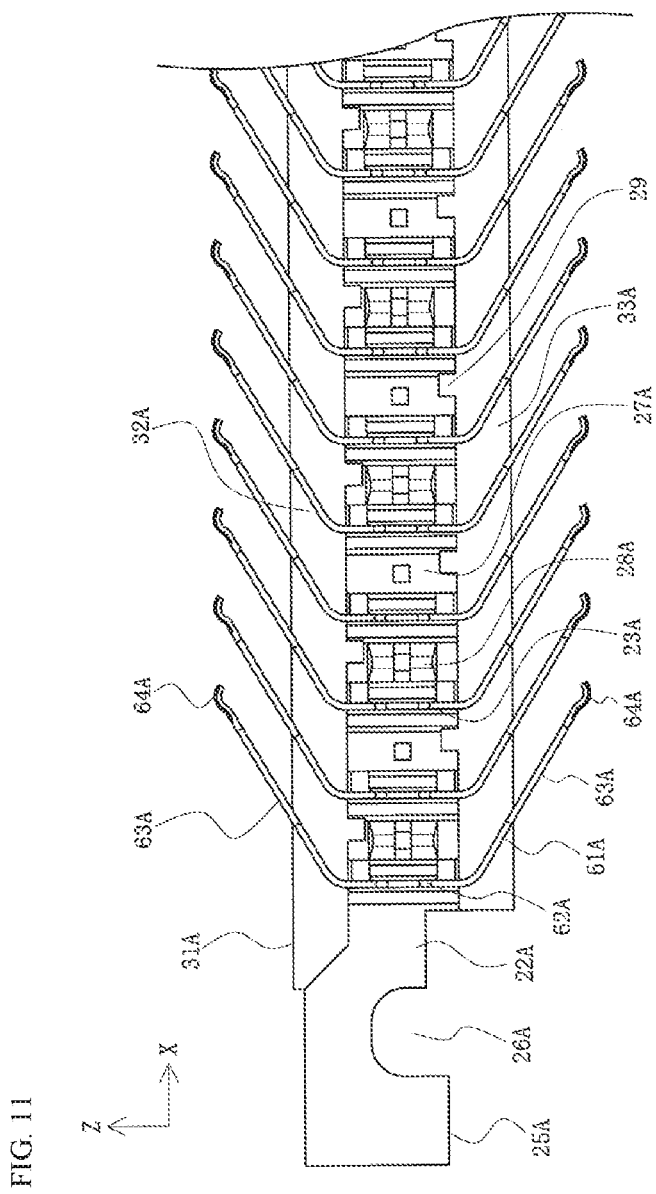
FIG. 11 is an enlarged side view of part A in FIG. 7 showing a main part of the first terminal unit according to the present embodiment.
Figure 12:
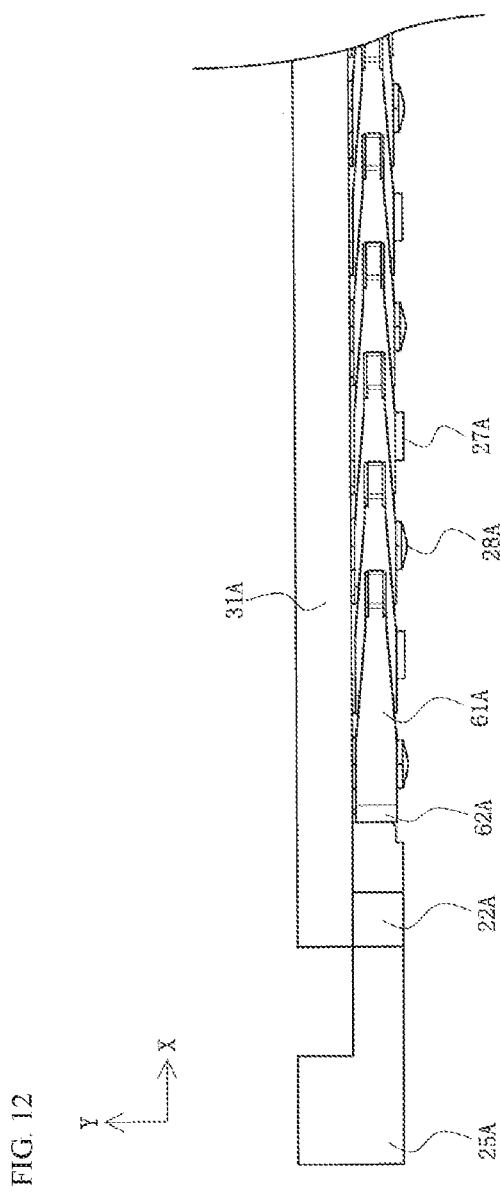
FIG. 12 is an enlarged top view of part A in FIG. 7 showing a main part of the first terminal unit according to the present embodiment.
Figure 13:
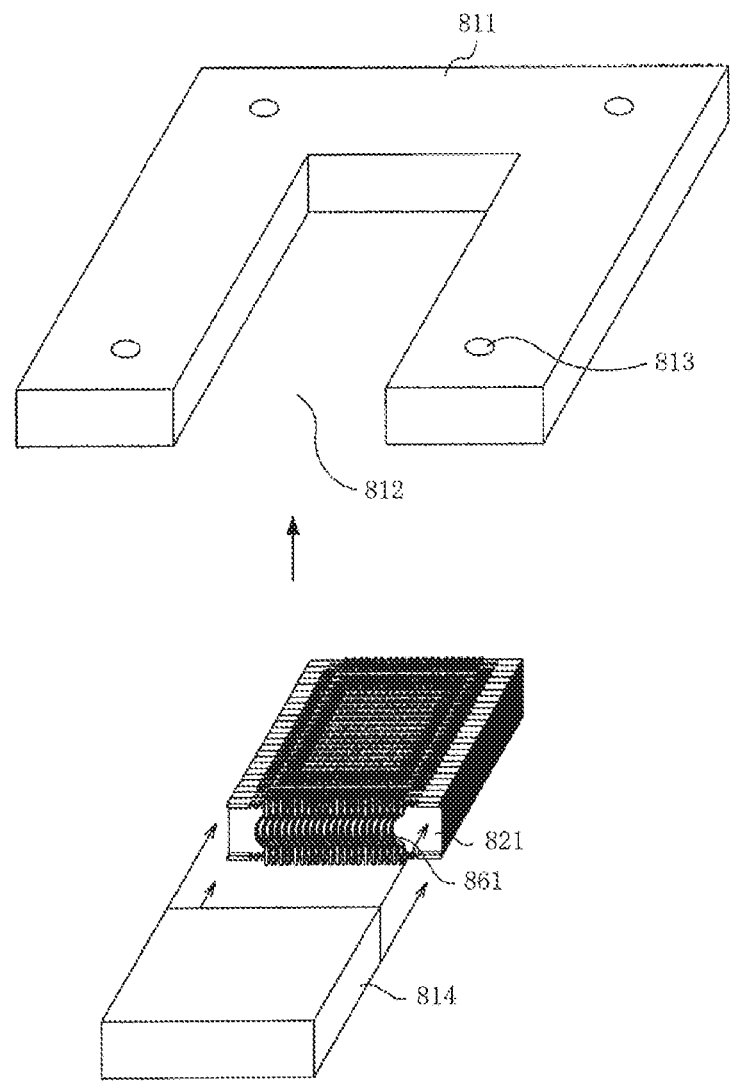
FIG. 13 is a perspective view of a conventional socket.

FIG. 4 is a perspective view of a small terminal unit assembly according to the present embodiment, FIG. 5 is a top view of a small terminal unit assembly according to the present embodiment. FIG. 6 is a perspective view showing a side wall of a first terminal unit according to the present embodiment, FIG. 7 is a perspective view showing a terminal side of the first terminal unit according to the present embodiment, FIG. 8 is a perspective view showing a side wall of a second terminal unit according to the present embodiment, FIG. 9 is a perspective view showing the terminal side of the second terminal unit according to the present embodiment, FIG. 10 is an enlarged perspective view of part A in FIG. 7 showing a main part of the first terminal unit according to the present embodiment, FIG. 11 is an enlarged side view of part A in FIG. 7 showing a main part of the first terminal unit according to the present embodiment, and FIG. 12 is an enlarged top view of part A in FIG. 7 showing a main part of the first terminal unit according to the present embodiment.

In the present embodiment, the terminal unit 30 extending in the longitudinal direction (X axis direction) includes a first terminal unit 30A and a second terminal unit 30B. In the terminal unit assembly 20, the first and the second terminal units 30A and 30B are alternately arranged in a lateral direction (Y axis direction). In FIGS. 4 and 5, a small terminal unit assembly 20 is shown. By accommodating and combining a plurality of such small terminal unit assemblies 20 in the assembly accommodating recess 12, it is possible to obtain a large terminal unit assembly 20 as shown in FIGS. 1 to 3.

The first terminal unit 30A and the second terminal unit 30B as well as each component of the first terminal unit 30A and its counterpart in the second terminal unit 30B may be mentioned below without distinction. In such a case, the terms "first" and "second" as well as reference signs "A" and "B" are omitted.

Figure 7:
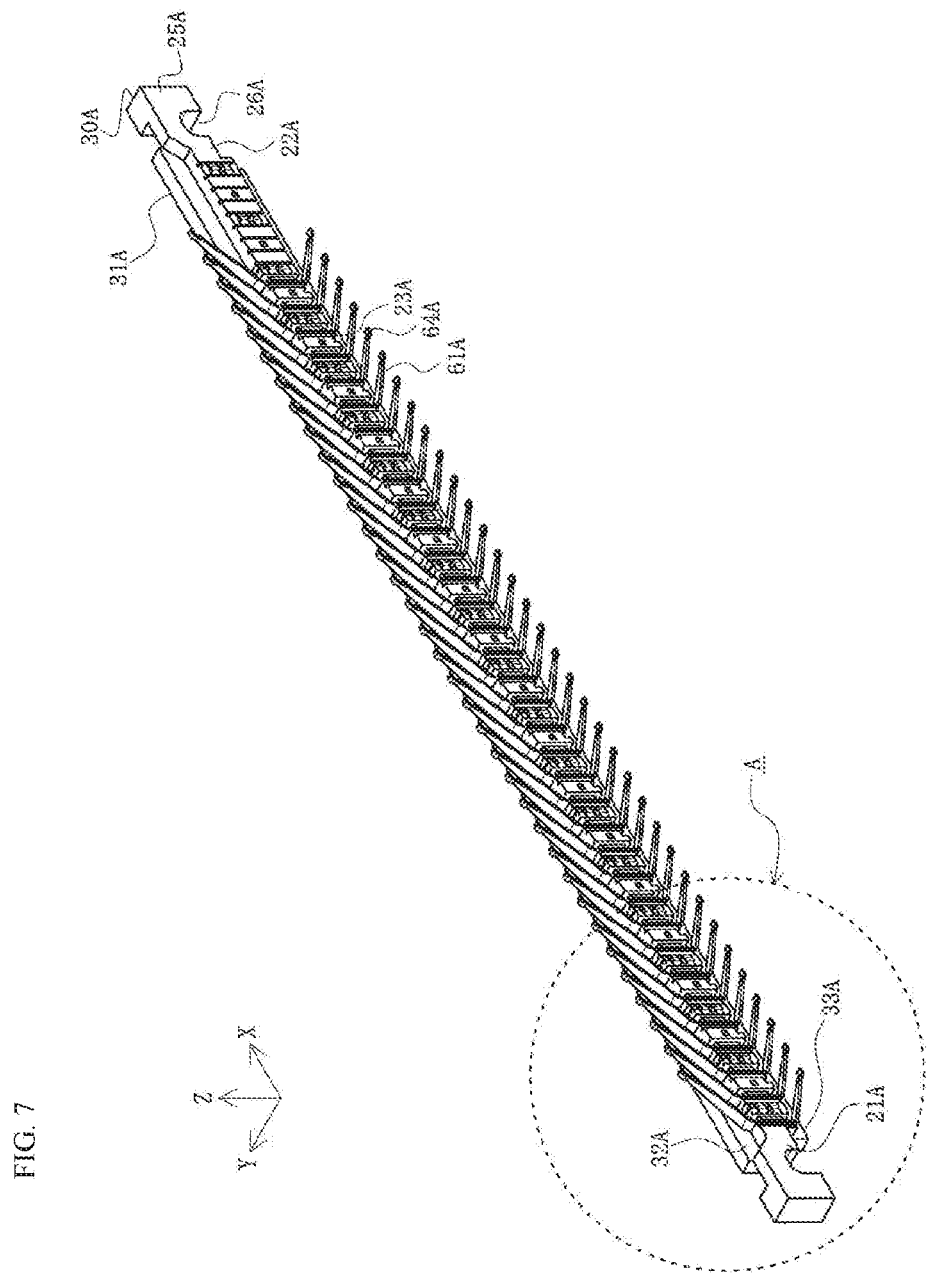
FIG. 7 is a perspective view showing a terminal side of the first terminal unit according to the present embodiment.

As shown in FIGS. 6 and 7, the first terminal unit 30A has a first terminal holding part 21A extending in the longitudinal direction integrally made of an insulating material such as a synthetic resin, a first side wall 31A as a housing wall extending in the longitudinal direction integrally made of an insulating material such as a synthetic resin, and a plurality of first terminals 61A made of a metal plate having a conductive spring property and held by the first terminal holding part 21A. The first terminal holding part 21A and the first side wall 31A are arranged to be adjacent to each other in the Y axis direction.

The first terminal holding part 21A includes an elongated first beam 22A extending in the longitudinal direction, and a first engaging part 25A connected to both longitudinal ends of the first beam 22A. The first engaging part 25A is a part engaged with the edge part 11c of the lateral frame part 11y, and further, a first engaging recess 26A is formed on the bottom face thereof, that is, the negative Z-axis direction face. It is preferable that the dimension of the end part of the first engaging part 25A in the lateral direction (i.e., the Y-axis direction), that is, the thickness, is set to be substantially equal to the sum total of the thickness of the first beam 22A and the thickness of the first side wall 31A. In the first beam 22A, a plurality of first terminal holding grooves 23A in the form of elongated slits extending in the longitudinal direction (i.e., the Z-axis direction) are formed at a pitch of, for example, about 0.8 [mm].

The first side wall 31A is a substantially rectangular plate member extending on an X-Z plane, and includes a first upper wall 32A basically positioned above the first beam 22A and a first lower wall 33A basically positioned below the first beam 22A.

The first terminal 61A is a plate member that has an elongated strip shape as a whole formed by performing processes such as punching or bending on a metal plate, and includes a first body 62A that is held by the first terminal holding groove 23A and extends in the vertical direction, a pair of first contact arms 63A connected to both ends of the first body 62A, and first contact parts 64A that are each curved and formed on a distal end of a corresponding one of the first contact arms 63A. Each first contact arm 63A extends obliquely forward from the first body 62A, and the first contact part 64A is formed at a free end thereof. The shape of the first terminal 61A in the X-Z plane is vertically symmetrical about an axis of symmetry extending in the front-rear direction (i.e., the X-axis direction) at the center of the first side wall 31A in the vertical direction.

The plurality of first terminals 61A are arranged so as to be aligned in the front-rear direction, and the first main bodies 62A of the adjacent first terminals 61A and the first contact arms 63A are parallel to each other with a space therebetween. In the initial state, each first contact part 64A and a part of the first contact arm 63A protrudes upward from the top face of the first upper wall 32A, which is the top face of the first terminal unit 30A, and protrudes downward from the bottom face of the first lower wall 33A, which is the bottom face of the first terminal unit 30A.

Further, the first beam 22A is provided with a plurality of first adhesive pieces 27A and a plurality of first contacting pieces 28A, which are protrusions protruding in the lateral direction (i.e., the Y-axis direction) of the terminal unit assembly 20 and function as distance-maintaining protrusions for maintaining a distance between the first adhesive pieces 27A and the adjacent second terminal units 30B. The first adhesive pieces 27A and the first contacting pieces 28A are alternately arranged in the front-rear direction so that a gap exists therebetween and are disposed between adjacent first terminal holding grooves 23A. As shown in FIG. 12, the first adhesive piece 27A and the first contacting piece 28A are formed so that the side face, which is the outermost face, protrudes toward the side wall 31 of the adjacent terminal unit 30, that is, toward the second side wall 31B of the second terminal unit 30B (in the negative Y-axis direction), more than the first terminal 61A, the other parts of the first beam 22A, and more than the first engaging part 25A.

The lateral face of the first adhesive piece 27A, that is, the distal face is a surface adhered to the lateral face of the second side wall 31B of the adjacent second terminal unit 30B via an adhesive (not shown), and is formed to be a plane parallel to the X-Z plane. The distal face of the first adhesive piece 27A also has a notch 29 for accommodating excess adhesive.

On the other hand, the lateral face of the first contacting piece 28A, that is, the distal face, is a surface that is deformed by being pressed against the lateral face of the second side wall 31B of the adjacent second terminal unit 30B, is a convex curved surface (preferably, a spherical surface), and is formed so as to protrude from the lateral face of the first adhesive piece 27A in the negative Y-axis direction. For example, in the example shown in FIG. 12, the dimension from the lateral face of the first side wall 31 A on the positive Y-axis direction side to the distal face of the first adhesive piece 27A may be about 0.8 [mm], and the dimension from the lateral face of the first side wall 31A on the positive Y-axis direction side to the distal face of the first contacting piece 28A may be about 0.82 [mm].

As shown in FIGS. 8 and 9, the second terminal unit 30B has a second terminal holding part 21B integrally formed from an insulating material such as a synthetic resin and extending in the longitudinal direction, a second side wall 31B as a housing wall integrally formed from an insulating material such as a synthetic resin and extending in the longitudinal direction, and a plurality of second terminals 61B made of a metal plate having a conductive spring property and held by the second terminal holding part 21B. The second terminal holding part 21B and the second side wall 31B are arranged to be adjacent to each other in the Y axis direction.

The second terminal holding part 21B includes an elongated second beam 22B extending in the longitudinal direction and a second engaging part 25B connected to both longitudinal ends of the second beam 22B. The second engaging part 25B is a part engaged with the edge part 11c of the lateral frame part 11y, and further, a second engaging recess 26B is formed on the bottom face thereof, that is, the negative Z-axis direction face. It is preferable that the dimension of the end part of the second engaging part 25 B in the lateral direction (Y-axis direction), that is, the thickness is set to be substantially equal to the sum of the thickness of the second beam 22B and the thickness of the second side wall part 31B. In the second beam 22B, a plurality of elongated slit-shaped second terminal holding grooves 23B extending in the longitudinal direction (i.e., the Z-axis direction) are formed at a pitch of, for example, about 0.8 [mm].

The second side wall 31B is a substantially rectangular plate member extending on the X-Z plane, and includes a second upper wall 32B basically positioned above the second beam 22B and a second lower wall 33B basically positioned below the second beam 22B.

The second terminal 61B is a plate member that has an elongated strip shape as a whole formed by performing processes such as punching or bending on a metal plate, and includes a second body 62B that is held by the second terminal holding groove 23B and extends in the vertical direction, a pair of second contact arms 63B connected to both ends of the second body 62B, and second contact parts 64B that are each curved and formed on a distal end of a corresponding second contact arms 63B. Each second contact arm 63B extends obliquely rearward from the second body 62B, and the second contact part 64B is formed at a free end thereof. The second terminal 61B has a substantially W shape on the X-Z plane that is symmetrical in the vertical direction about the symmetric axis extending in the front and back direction while passing through the center of the second side wall 31B in the vertical direction.

The plurality of second terminals 61B are arranged so as to be aligned in the front-rear direction, and the second main bodies 62B of the adjacent second terminals 61B and the second contact parts 64B are parallel to each other with a space therebetween. In the initial state, each second contact part 64B and a part of the second contact arm 63B protrudes upward from the top face of the second upper wall 32B, which is the top face of the second terminal unit 30B, and protrudes downward from the bottom face of the second lower wall 33B, which is the bottom face of the second terminal unit 30B.

Further, the second beam 22B is provided with a plurality of second adhesive pieces 27B and second contacting pieces 28B, which are protrusions protruding in the lateral direction (i.e., the Y-axis direction) of the terminal unit assembly 20 and function as distance-maintaining protrusions for maintaining a distance between adjacent first terminal units 30A.

The second adhesive pieces 27B and the second contacting pieces 28B are alternately arranged in the front-rear direction so that a gap exists therebetween and are disposed between adjacent second terminal holding grooves 23B. Since the configurations of the second adhesive piece 27B and the second contacting piece 28B are substantially the same as the configurations of the first adhesive piece 27A and the first contacting piece 28A, detailed description thereof will be omitted.

When the small terminal unit assembly 20 as shown in FIGS. 4 and 5 is configured, the first terminal units 30A and the second terminal units 30B are alternately arranged in the lateral direction (i.e., the Y-axis direction). An adhesive is applied between the distal face of the adhesive piece 27A, 27B formed on the beam 22A, 22B of each terminal unit 30A, 30B and the lateral face of the side wall 31A, 31B of the terminal unit 30A, 30B adjacent thereto. The terminal units 30A 30B are compressed in the lateral direction while being alternately arranged in the lateral direction. As the contacting pieces 28A, 28B formed on the beam 22A, 22B of each terminal unit 30A, 30B are the most protruded toward the side wall 31A, 31B of adjacent terminal unit 30A, 30B, the contacting pieces 28A, 28B first contact the lateral face of the side wall 31A, 31B and then are pressed laterally to compress and deform, reducing the extent of protrusion. When the extent of protrusion of the contacting piece 28A, 28B decreases, the distal face of the adhesive piece 27A, 27B abuts the lateral face of the side wall 31A, 31B and is adhered to the lateral face of the side wall 31A, 31B by the adhesive. The excess adhesive is accommodated in the notch 29 in the distal face of the adhesive piece 27A, 27B.

As a result, there is no lateral gap between the adjacent terminal units 30A, 30B, and the lateral dimension of the terminal unit assembly 20 becomes a predetermined value. Further, since the distal face of the adhesive piece 27A, 27B is adhered to the lateral face of the side wall 31A, 31B, the terminal units 30A 30B adjacent to each other are adhered to each other in a state in which there is no gap in the lateral direction, and the lateral dimension of the terminal unit assembly 20 is maintained at a predetermined value. Further, the contacting pieces 28A, 28B formed so as to protrude with respect to the pitch of the terminal units 30A, 30B arranged in the lateral direction are pressed to become compressed and deformed, allowing the pitch of the terminal units 30A, 30B in the terminal unit assembly 20 to be made a predetermined value, thereby improving the dimensional accuracy of the terminal unit assembly 20 in the lateral direction. A predetermined number of small terminal unit assemblies 20 configured as described above are accommodated and assembled in the assembly accommodating recess 12 of the frame member 11.

As described above, in the present embodiment, the socket 1 includes a terminal unit assembly 20 in which a plurality of terminal units 30A, 30B extending in a longitudinal direction are arranged in a lateral direction orthogonal to the longitudinal direction, and a frame member 11 including an assembly accommodating recess 12 accommodating the terminal unit assembly 20; and each terminal unit 30A, 30B includes a terminal holding part 21A, 21B extending in the longitudinal direction, a main body 62A, 62B held by the terminal holding part 21A, 21B, contact parts 64A, 64B protruding above the top face or below the bottom face of the terminal unit 30A, 30B, a plurality of terminals 61A 61B including the contact arms 63A, 63B connecting the main body 62A, 62B to the contact parts 64A 64B, and a side wall 31A, 31B extending in the longitudinal direction; and the terminal holding part 21A, 21B includes a plurality of adhesive pieces 27A, 27B and contacting pieces 28A, 28B protruding in the lateral direction, and at least one of the adhesive pieces 27A, 27B and the contacting pieces 28A, 28B abuts the side wall 31A, 31B of the adjacent terminal unit 30A, 30B.

As a result, the dimensional tolerances of the individual members do not accumulate and become large, the dimensional accuracy of the terminal unit assembly 20 in the lateral direction is improved, the structure of the socket 1 is simplified, the cost is reduced, and the durability is improved.

The adhesive piece 27A, 27B abuts the side wall 31A, 31B of the adjacent terminal unit 30A, 30B via an adhesive. Further, the distal face includes an adhesive piece 27A, 27B that abuts the side wall 31A, 31B of the adjacent terminal unit 30A, 30B via an adhesive, and a contacting piece 28A, 28B that deforms by way of the distal face abutting the side wall 31A, 31B of the adjacent terminal unit 30A, 30B. Further, the extent of protrusion of the contacting piece 28A, 28B in the lateral direction is larger than the extent of protrusion of the adhesive piece 27A, 27B in the lateral direction. Further, a gap exists between the contacting piece 28A, 28B and the adhesive piece 27A, 27B. Further, the contacting pieces 28A, 28B and the adhesive pieces 27A, 27B are alternately arranged in the longitudinal direction. Further, the positions of the contacting pieces 28A, 28B in the longitudinal direction are different from the positions of the contacting pieces 28A, 28B of the adjacent terminal unit 30A, 30B in the longitudinal direction. Further, the contacting pieces 28A, 28B of the terminal unit assembly 20 are staggered in plan view. Further, in a method of manufacturing the socket 1, the terminal unit assembly 20 is assembled by compressing a plurality of terminal units 30A, 30B arranged side by side in the lateral direction and deforming the distal faces of the contacting pieces 28A, 28B against the side wall 31A, 31B of an adjacent terminal unit 30A 30B.

As described above, in the normal case, the lateral dimension of the terminal unit 30A, 30B is made smaller than the predetermined pitch of the terminal units 30A, 30B arranged in the lateral direction in consideration of the tolerance, whereas in the present embodiment, the protrusion amount of the contacting piece 28A, 28B is increased, and when the terminal unit assembly 20 is configured by arranging the plurality of terminal units 30A, 30B in the lateral direction, the extra protrusion amount of the contacting piece 28A, 28B is compressed and reduced, thereby improving the lateral dimension accuracy.

Note that the disclosure of the present specification describes characteristics related to preferred and exemplary embodiments. Various other embodiments, modifications and variations within the scope and spirit of the claims appended hereto could naturally be conceived by persons skilled in the art by summarizing the disclosures of the present specification.

The present disclosure is applicable to sockets.

The invention claimed is:

1. A socket, comprising:
a frame member, the frame member having a first pair of frame parts which extend in a longitudinal direction and a second pair of frame parts which extend in the lateral direction, the longitudinal direction being orthogonal to the lateral direction, the first pair of frame parts and the second pair of frame parts being connected to one another such that the frame member has a generally rectangular configuration, the frame member defining an assembly accommodating recess between the first and second pairs of frame parts; and
a terminal unit assembly that is configured to be substantially positioned within the assembly accommodating recess, the terminal unit assembly comprising a plurality of terminal units, each terminal unit extending in the longitudinal direction, adjacent terminal units being arranged in the lateral direction,
wherein each terminal unit includes a terminal holding part extending in the longitudinal direction, each terminal holding part spanning the assembly accommodating recess and being configured to be engaged with the second pair of frame parts, each terminal holding part includes a plurality of protrusions which protrude in the lateral direction,
wherein each terminal unit includes a housing wall extending in the longitudinal direction, the housing wall and the terminal holding part of each terminal unit being arranged to be adjacent to each other in the lateral direction, at least one of the plurality of protrusions of each terminal holding part abutting the housing wall of an adjacent terminal unit, and
wherein each terminal unit has a plurality of terminals held by the terminal holding part, the plurality of terminals including contact parts protruding above a top face and/or below a bottom face of the terminal unit.

2. The socket of claim 1, wherein the at least one of the plurality of protrusions abuts the housing wall of the adjacent terminal unit via an adhesive.

3. The socket of claim 1, wherein the at least one protrusion of the plurality of protrusions is deformed by abutting the housing wall of an adjacent terminal unit.

4. The socket of claim 1, wherein one or more of the plurality of protrusions are adhesive pieces having distal faces abutting the housing wall of the adjacent terminal unit via an adhesive and wherein one or more of the plurality of protrusions are contacting pieces having distal faces deformed by the abutting housing wall of the adjacent terminal unit.

5. The socket of claim 4, wherein an extent of lateral protrusion of each contacting piece is larger than an extent of lateral protrusion of each adhesive piece.

6. The socket of claim 4, wherein a gap exists between adjacent protrusions.

7. The socket of claim 4, wherein the protrusions are arranged alternately between contacting pieces and adhesive pieces in the longitudinal direction.

8. The socket of claim 4, wherein the contacting pieces of the terminal unit and the contacting pieces of the adjacent terminal unit are in different positions in the longitudinal direction.

9. The socket of claim 8, wherein the contacting pieces of the terminal unit assembly are staggered in plan view.

10. A method of manufacturing the socket according to claim 4, wherein the terminal unit assembly is assembled by compressing a plurality of terminal units arranged side by side in the lateral direction and deforming the distal faces of the contacting pieces against the housing walls of adjacent terminal units.

11. The socket of claim 1, wherein the first pair of frame parts and the second pair of frame parts each having top surfaces which are planar with one another.

12. The socket of claim 1, wherein the assembly accommodating recess is bounded in the longitudinal direction by the second pair of frame parts and is bounded in the lateral direction by the first pair of frame parts.

13. The socket of claim 12, wherein the assembly accommodating recess has a generally rectangular configuration.

14. A terminal unit assembly which is configured to be held in a frame member to form a socket, the terminal unit assembly comprising:
- a first terminal unit, the first terminal unit having a first terminal holding part and a first housing wall, the first terminal holding part having an elongated first beam and a plurality of first terminals, the elongated first beam extending in a longitudinal direction and having opposite longitudinal ends the first terminal holding, part having, a plurality of first terminal holding grooves which are accessible in the lateral direction away from the first housing wall, the plurality of first terminals held by the elongated first beam in respective first terminal holding grooves, each first terminal having an upper contact part which protrudes above a top face of the elongated first beam, the elongated first beam having a plurality of protrusions which protrude therefrom in the lateral direction away from the first housing wall, each protrusion being disposed between adjacent first terminal holding grooves; and
- a second terminal unit, the second terminal unit having a second terminal holding part and a second housing wall which are arranged to be adjacent to each other in a lateral direction, the second terminal holding part having an elongated second beam and a plurality of second terminals, the elongated second beam extending in the longitudinal direction and having opposite longitudinal ends, the plurality of second terminals held by the elongated second beam, each second terminal having an upper contact part which protrudes above a top face of the elongated second beam,
wherein the plurality of protrusions of the elongated first beam abut the second housing wall.

15. The terminal unit assembly as defined in claim 14, wherein the first housing wall and the elongated first beam being arranged to be adjacent to each other in the lateral direction, the plurality of protrusions protruding from the elongated first beam protrude therefrom in the lateral direction away from the first housing wall.

16. The terminal unit assembly as defined in claim 14, wherein the elongated second beam has a plurality of protrusions which protrude therefrom in the lateral direction away from the second housing wall.

17. The terminal unit assembly as defined in claim 16, further comprising a third terminal unit, the third terminal unit having a third terminal holding part and a third housing wall which are arranged to be adjacent to each other in a lateral direction, the third terminal holding part having an elongated third beam, a pair of third engaging parts, and a plurality of third terminals, the elongated third beam extending in the longitudinal direction and having opposite longitudinal ends, the pair of third engaging parts connected to the longitudinal ends of the elongated third beam, the plurality of third terminals held by the elongated third beam, each third terminal having an upper contact part which protrudes above a top face of the elongated third beam, wherein the plurality of protrusions of the elongated second beam abut the third housing wall.

18. The terminal unit assembly as defined in claim 14, wherein the first terminal unit has a pair of first engaging parts, the pair of first engaging parts being connected to the longitudinal ends of the elongated first beam, wherein the second terminal unit has a pair of second engaging parts, the pair of second engaging parts being connected to the longitudinal ends of the elongates second beam, and wherein the pair of first engaging parts of the pair of second engaging parts are configured to be connected to the frame member.

19. The terminal unit assembly as defined in claim 18, wherein each of the pair of first engaging parts has a first engaging recess formed on a bottom face thereof, and wherein each of the pair of second engaging parts has a second engaging recess formed on a bottom face thereof.

20. The terminal unit assembly of claim 14, wherein one or more of the plurality of protrusions are adhesive pieces having distal faces abutting second housing wall via an adhesive and wherein one or more of the plurality of protrusions are contacting pieces having distal faces deformed by the second housing wall.

21. The terminal unit assembly of claim 20, wherein an extent of lateral protrusion of each contacting piece is larger than an extent of lateral protrusion of each adhesive piece.

22. The terminal unit assembly of claim 20, wherein a gap exists between adjacent protrusions.

23. The terminal unit assembly of claim 20, wherein the protrusions are arranged alternately between contacting pieces and adhesive pieces in the longitudinal direction.

24. The terminal unit assembly as defined in claim 14, wherein each first terminal has a body and an upper contact arm, the body being held in a respective one of the first terminal holding grooves, the upper contact arm extending obliquely from the body in the longitudinal direction, the upper contact part being provided at a free end of the upper contact arm.

25. The terminal unit assembly as defined in claim 24, wherein each first terminal has a lower contact arm and a lower contact arm, the lower contact arm extending obliquely from the body in the longitudinal direction, the lower contact part being provided at a free end of the lower contact arm, the lower contact part protruding below a bottom face of the elongated first beam.

26. A terminal unit assembly which is configured to be held in a frame member to form a socket, the terminal unit assembly comprising:
- a first terminal unit, the first terminal unit having a first terminal holding part and a first housing wall, the first terminal holding part having an elongated first beam and a plurality of first terminals, the elongated first beam extending in a longitudinal direction and having opposite longitudinal ends, each first terminal having a body, an upper contact arm and an upper contact part, each body being held by the elongated first beam, each upper contact arm extending obliquely from a respective body in the longitudinal direction, each upper contact part being provided at a free end of the respective upper contact arm, each upper contact part protruding above a top face of the elongated first beam, the elongated first beam having a plurality of protrusions which protrude therefrom in the lateral direction away from the first housing wall; and
- a second terminal unit, the second terminal unit having a second terminal holding part and a second housing wall which are arranged to be adjacent to each other in a lateral direction, the second terminal holding part having an elongated second beam and a plurality of second terminals, the elongated second beam extending in the longitudinal direction and having opposite longitudinal ends, the plurality of second terminals held by the elongated second beam, each second terminal having an upper contact part which protrudes above a top face of the elongated second beam, wherein the plurality of protrusions of the elongated first beam abut the second housing wall.

* * * * *